(12) United States Patent
Choi et al.

(10) Patent No.: US 11,682,436 B2
(45) Date of Patent: *Jun. 20, 2023

(54) MEMORY DEVICE, OPERATING METHOD OF THE MEMORY DEVICE AND MEMORY SYSTEM COMPRISING THE MEMORY DEVICE

(71) Applicant: Samsung Electronics Co., Ltd., Suwon-si (KR)

(72) Inventors: Hyeok Jun Choi, Suwon-si (KR); Young Chul Cho, Seongnam-si (KR); Seung Jin Park, Hwaseong-si (KR); Jae Woo Park, Yongin-si (KR); Young Don Choi, Seoul (KR); Jung Hwan Choi, Hwaseong-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 0 days.

This patent is subject to a terminal disclaimer.

(21) Appl. No.: 17/375,318

(22) Filed: Jul. 14, 2021

(65) Prior Publication Data

US 2022/0148634 A1   May 12, 2022

(30) Foreign Application Priority Data

Nov. 9, 2020 (KR) ........................ 10-2020-0148208

(51) Int. Cl.
*G11C 7/22* (2006.01)
*H03L 7/081* (2006.01)
*G11C 7/10* (2006.01)

(52) U.S. Cl.
CPC ............ *G11C 7/222* (2013.01); *G11C 7/1057* (2013.01); *G11C 7/1084* (2013.01); *H03L 7/0814* (2013.01)

(58) Field of Classification Search
CPC ...... G11C 7/222; G11C 7/1057; G11C 7/1084; G11C 2207/2254; G11C 7/1066;
(Continued)

(56) References Cited

U.S. PATENT DOCUMENTS 6,775,339 B1  8/2004  Wildes et al.
8,004,336 B2  8/2011  Yoon et al.
(Continued)

FOREIGN PATENT DOCUMENTS

JP    2011060385 A  *  3/2011  ......... G11C 11/4076
JP    2013-236246 A    11/2013
JP    2016103715 A  *  6/2016

*Primary Examiner* — Fernando Hidalgo
(74) *Attorney, Agent, or Firm* — Harness, Dickey & Pierce, P.L.C.

(57) ABSTRACT

A memory device in which reliability of a clock signal is improved is provided. The memory device comprises a data module including a clock signal generator configured to receive an internal clock signal from a buffer, and to generate a first internal clock signal, a second internal clock signal, a third internal clock signal, and a fourth internal clock signal having different phases, on the basis of the internal clock signal, and a first data signal generator configured to generate a first data signal on the basis of first data and the first internal clock signal, generate a second data signal on the basis of second data and the second internal clock signal, generate a third data signal on the basis of third data and the third internal clock signal, and generate a fourth data signal on the basis of fourth data and the fourth internal clock signal.

20 Claims, 17 Drawing Sheets

(58) Field of Classification Search
CPC ..... G11C 7/1069; G11C 7/1093; G11C 7/225; G11C 11/4076; G11C 11/4096; G11C 29/50012; G11C 11/406; G11C 11/15; H03L 7/0814; H03K 5/1565
USPC ...................................................... 365/233.1
See application file for complete search history.

(56) References Cited

U.S. PATENT DOCUMENTS

| | | | |
|---|---|---|---|
| 8,209,560 | B2 | 6/2012 | Ishikawa |
| 8,400,196 | B2 | 3/2013 | Kim |
| 8,780,653 | B2 | 7/2014 | Ito et al. |
| RE46,231 | E * | 12/2016 | Monma ................. H03K 3/017 |
| 10,680,592 | B2 | 6/2020 | Zhao et al. |
| 2006/0044037 | A1 * | 3/2006 | Gomm .................. H03K 5/135 327/261 |
| 2006/0092929 | A1 | 5/2006 | Chun |
| 2010/0117692 | A1 * | 5/2010 | Yoon .................... H03K 5/1565 327/144 |
| 2011/0298513 | A1 * | 12/2011 | Na ....................... H03K 5/1565 327/175 |
| 2020/0051603 | A1 * | 2/2020 | Kitagawa ............. G11C 7/1096 |
| 2020/0211606 | A1 * | 7/2020 | Kim ..................... G11C 7/1012 |
| 2020/0219548 | A1 * | 7/2020 | Jeong .................. G11C 7/1072 |
| 2020/0336148 | A1 * | 10/2020 | Im .......................... H03L 7/085 |
| 2021/0304808 | A1 * | 9/2021 | Penney ............... G11C 11/4091 |
| 2021/0305989 | A1 * | 9/2021 | Han ...................... H03K 5/131 |
| 2022/0094339 | A1 * | 3/2022 | Kim ..................... H03L 7/0814 |
| 2022/0109434 | A1 * | 4/2022 | Han ......................... G06F 1/10 |
| 2022/0368333 | A1 * | 11/2022 | Park ..................... H03L 7/0814 |

\* cited by examiner

MEMORY DEVICE, OPERATING METHOD OF THE MEMORY DEVICE AND MEMORY SYSTEM COMPRISING THE MEMORY DEVICE

This application claims priority from Korean Patent Application No. 10-2020-0148208 filed on Nov. 9, 2020 in the Korean Intellectual Property Office, the disclosure of which is incorporated herein by reference in its entirety.

BACKGROUND

Inventive concepts relate to a memory device, a method of operating the memory device, and a memory system including the memory device. Specifically, inventive concepts relate to a memory device including a clock signal generator, a method of operating the memory device, and/or a memory system including the memory device.

General semiconductor devices may transmit data and/or receive data in synchronization with a clock signal. The clock signal provided to the semiconductor device may be distorted while passing through the inside of the semiconductor device. For example, the clock signal provided to the semiconductor device may be delayed and/or a duty cycle of the clock signal may be distorted.

For example, when clock signals having a plurality of phases are transferred inside the semiconductor device, the plurality of clock signals may undergo a phase skew between the clocks, and/or the duty cycle may be changed. When a phase skew occurs between the clocks of a plurality of clock signals in this way, there may be a problem of a decrease in a setup margin and/or a hold margin of a circuit which samples the data when using the clock signal.

SUMMARY

Aspects of example embodiments provide a memory device in which reliability of a clock signal is improved.

Alternatively or additionally, aspects of inventive concepts may also provide a method of operating a memory device in which the reliability of the clock signal is improved.

Alternatively or additionally, aspects of inventive concepts may also provide a memory system in which the reliability of the clock signal is improved.

However, aspects of inventive concepts are not restricted to the one set forth herein. The above and other aspects of inventive concepts will become more apparent to one of ordinary skill in the art to which inventive concepts pertains by referencing the detailed description of inventive concepts given below.

According to some example embodiments of inventive concepts, a memory device includes a first buffer configured to receive an external clock signal and to generate an internal clock signal on the basis of the external clock signal, a second buffer configured to receive the internal clock signal from the first buffer, and a processing circuitry configured to receive the internal clock signal from the second buffer. the processing circuitry is configured to execute machine-readable instructions to receive the internal clock signal from the second buffer, to generate a first internal clock signal, a second internal clock signal, a third internal clock signal, and a fourth internal clock signal, each of the first through fourth internal clock signals having different phases, each of the first through fourth internal clock signals generated on the basis of the internal clock signal, to generate a first data signal on the basis of first data and the first internal clock signal, to generate a second data signal on the basis of second data and the second internal clock signal, to generate a third data signal on the basis of third data and the third internal clock signal, and to generate a fourth data signal on the basis of fourth data and the fourth internal clock signal.

According to some example embodiments of inventive concepts, a method of operating a memory device includes receiving an external clock signal from a memory controller circuitry, generating an internal clock signal on the basis of the external clock signal, buffering the generated internal clock signal, transferring the buffered internal clock signal to a data module circuitry controlled by the memory controller circuitry, generating a first internal clock signal, a second internal clock signal, a third internal clock signal, and a fourth internal clock signal having different phases from each other, on the basis of the buffered internal clock signal transferred to the data module circuitry, generating a first data signal on the basis of first data and the generated first internal clock signal, generating a second data signal on the basis of second data and the generated second internal clock signal, generating a third data signal on the basis of third data and the generated third internal clock signal, generating a fourth data signal on the basis of fourth data and the generated fourth internal clock signal, and outputting the generated first to fourth data signals.

According to some example embodiments of inventive concepts, a memory system includes a memory controller circuitry, and a memory device which is connected to the memory controller circuitry and is configured to receive an external clock signal from the memory controller circuitry. The memory device includes, a memory cell array including a plurality of memory cells, a processing circuitry connected between the memory cell array and the memory controller circuitry, a second buffer configured to receive an external clock signal from the memory controller circuitry and to generate an internal clock signal on the basis of the external clock signal, and a plurality of second buffers configured to receive the internal clock signal from the second buffer and to provide the received internal clock signal to the processing circuitry, and the processing circuitry is configured to receive the internal clock signal from the buffer, to generate first to fourth internal clock signals having different phases from each other on the basis of the internal clock signal, to receive the first to fourth internal clock signals, to correct skew and duty cycle of the first to fourth internal clock signals, to receive data which is read from the memory cell array, to receive the corrected first to fourth internal clock signal, and to be synchronized with the first to fourth internal clock signals to output a data signal including the data.

Other features and example embodiments may be apparent from the following detailed description, the drawings, and the claims.

BRIEF DESCRIPTION OF THE DRAWINGS

The above and other example embodiments and features of inventive concepts will become more apparent by describing in detail example embodiments thereof with reference to the attached drawings, in which.

DETAILED DESCRIPTION OF SOME EXAMPLE EMBODIMENTS

Hereinafter, some example embodiments according to the technical idea of inventive concepts will be described referring to the accompanying drawings.

Figure 1:
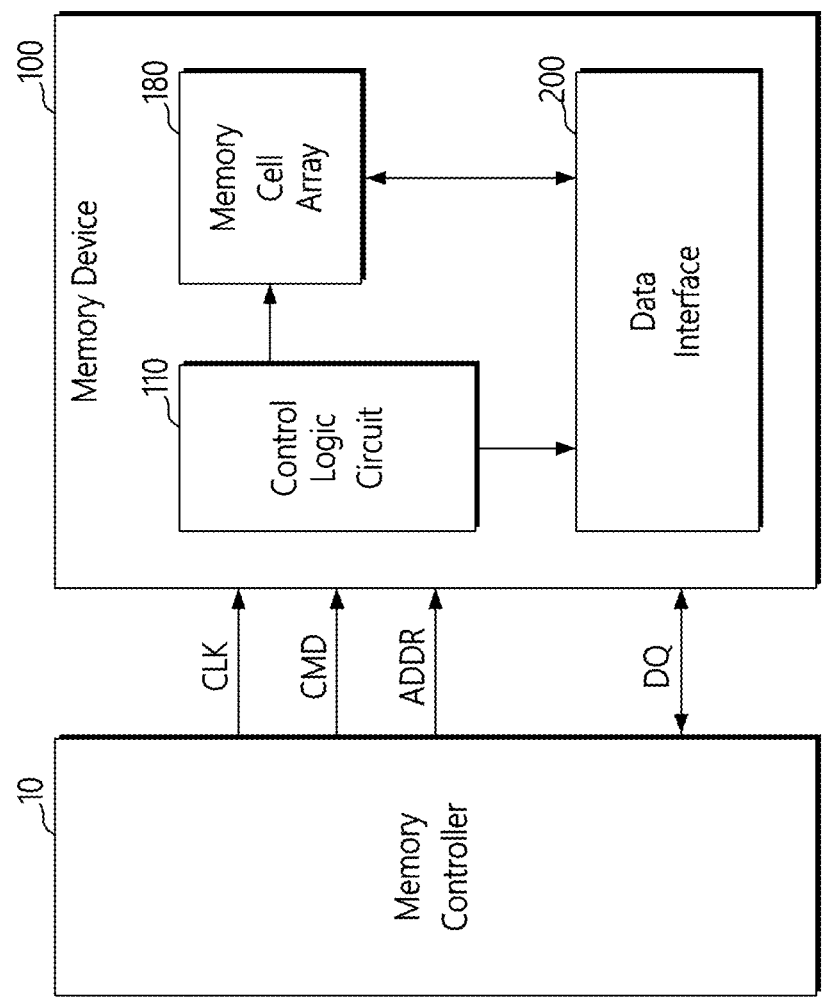
FIG. 1 is a block diagram of a memory system according to some example embodiments.

FIG. 1 is a block diagram of a memory system according to some example embodiments.

Referring to FIG. 1, the memory system 1 may include a memory controller 10 and a memory device 100.

The memory controller 10 may generally control the operation of the memory system 1. For example, the memory controller 10 may control a data exchange between the external host and the memory device 100. For example, the memory controller 10 may control the memory device 100 in response to a request from the host, and may write and/or read data accordingly.

The memory controller 10 may control the operation of the memory device 100 by applying a command CMD for controlling the memory device 100. Here, the memory device 100 may include dynamic memory cells. For example, the memory device 100 may include at least one of a DRAM (dynamic random access memory), a DDR4 (double data rate 4), a SDRAM (synchronous DRAM), a LPDDR4 (low power DDR4) SDRAM, LPDDR5 SDRAM, and the like. However, example embodiments are not limited thereto, and the memory device 100 may also include a non-volatile memory device.

The memory controller 10 may transmit at least one of a clock signal CLK, a command CMD, an address ADDR, and the like to the memory device 100. The memory controller 10 may provide a data signal DQ to the memory device 100, and may receive the data signal DQ from the memory device 100. The memory device 100 may include a memory cell array 180, a control logic circuit 110, a data interface 200, and/or the like in which data of the data signal DQ is stored.

The data interface 200 may receive the data signal DQ, and may provide the data of the data signal DQ to the memory cell array 180 to input the data. Further, the data interface 200 may also provide the memory controller 10 with the data signal DQ having data that is read from the memory cell array 180. The control logic circuit 110 may control an access to the memory cell array 180 and control the operation of the data interface 200, on the basis of the command CMD and the address ADDR.

Figure 2:
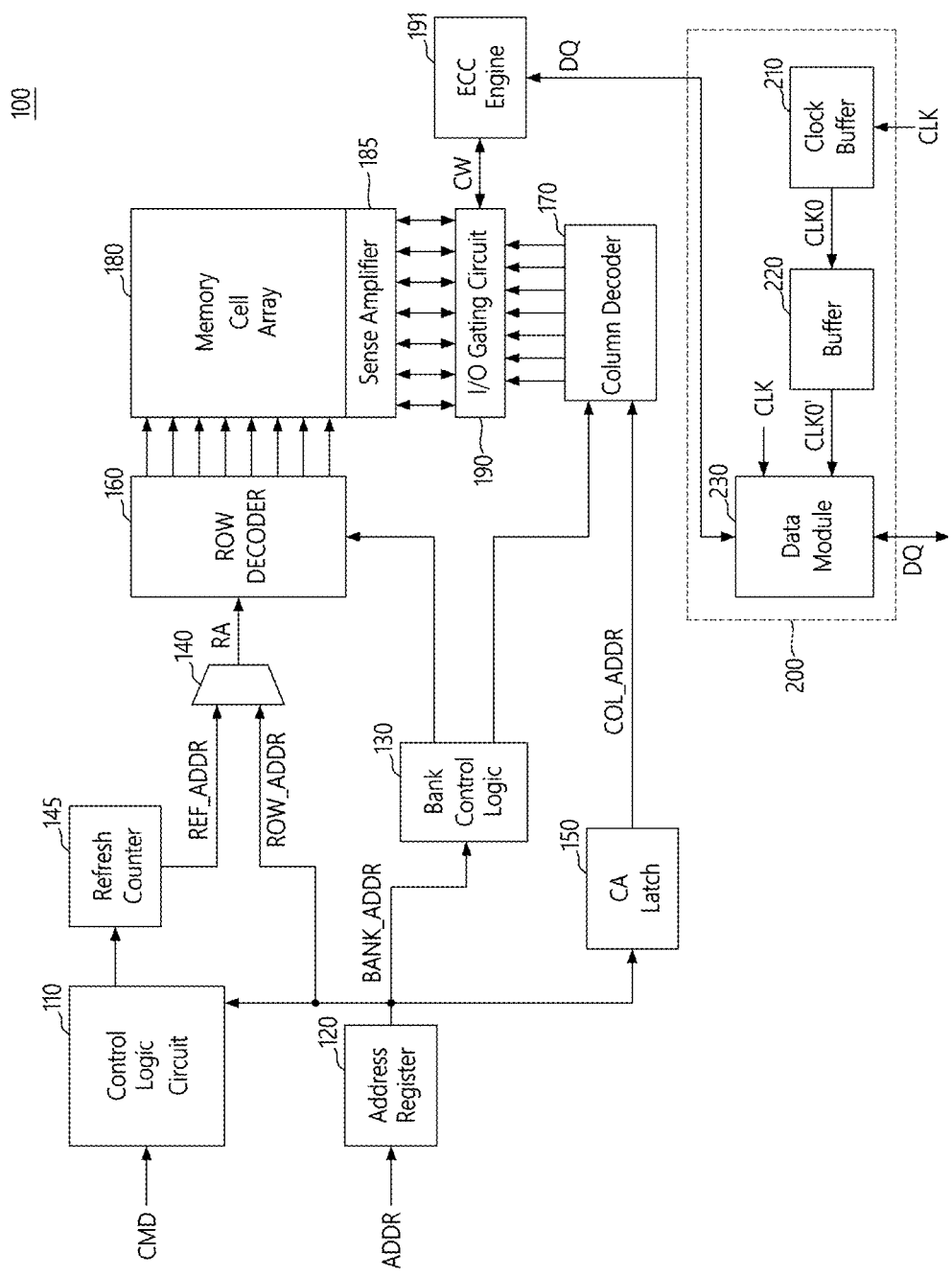
FIG. 2 is a block diagram of a memory device according to some example embodiments.

FIG. 2 is a block diagram of a memory device according to some example embodiments.

Referring to FIG. 2, the memory device 100 may include a control logic circuit 110, an address register 120, a bank control logic circuit 130, a row address multiplexer 140, a refresh counter 145, a column address latch 150, a row decoder 160, a column decoder 170, a memory cell array 180, a sense amplifier 185, an I/O gating circuit 190, an ECC engine 191, a data interface 200, and the like.

The memory cell array 180 may include a plurality of bank arrays. The row decoder 160 may be connected to a plurality of bank arrays. The column decoder 170 may be connected to each of the plurality of bank arrays. The sense amplifier 185 may be connected to each of the plurality of bank arrays. The memory cell array 180 may include a plurality of word lines (e.g. rows), a plurality of bit lines (e.g. columns), and a plurality of memory cells formed at a point on which the word lines and the bit lines intersect each other.

The address register 120 may receive the address ADDR from the memory controller 10. The address ADDR may include a bank address BANK_ADDR, a row address ROW_ADDR, a column address COL_ADDR, and/or the like. The address register 120 may provide the bank address BANK_ADDR to the bank control logic circuit 130. The address register 120 may provide the row address ROW_ADDR to the row address multiplexer 140. The address register 120 may provide the column address COL_ADDR to the column address latch 150.

The bank control logic circuit 130 may generate a bank control signal in response to the bank address BANK_ADDR. The bank row decoder 160 may be activated in response to the bank control signal. Additionally, the column decoder 170 may also be activated in response to the bank control signal corresponding to the bank address BANK_ADDR.

The row address multiplexer 140 may receive the row address ROW_ADDR from the address register 120, and receive the refresh row address REF_ADDR from the refresh counter 145. The row address multiplexer 140 may select one of the row address ROW_ADDR or the refresh row address REF_ADDR and output it to the row address RA. The row address RA may be transferred to the row decoder 160.

The refresh counter 145 may sequentially output the refresh row address REF_ADDR according to the control of the control logic circuit 110.

The row decoder 160 activated by the bank control logic circuit 130 may decode the row address RA that is output from the row address multiplexer 140, and activate the word line corresponding to the row address RA. For example, the row decoder 160 may apply a word line drive voltage to the word line corresponding to the row address RA.

The column address latch 150 may receive the column address COL_ADDR from the address register 120, and may temporarily store the received column address COL_ADDR. The column address latch 150 may gradually increase the column address COL_ADDR received in a burst mode. The column address latch 150 may provide the column decoder 170 with a temporarily stored column address COL_ADDR or a gradually increased column address COL_ADDR.

The column decoder 170 activated by the bank control logic circuit 130 among the column decoders 170 may activate the sense amplifier 185 corresponding to the bank address BANK_ADDR and the column address COL_ADDR through the corresponding I/O gating circuit 190.

The I/O gating circuit 190 may include a gating circuit that gates the I/O data, an input data mask logic, read data latches that store the data output from the memory cell array 180, and write drivers that write data in the memory cell array 180.

A code word CW which is read from the bank array of the memory cell array 180 may be detected by the sense amplifier 185 corresponding to the bank array. Additionally, the code word CW may be stored in the read data latch. The code word CW stored in the read data latch may be subjected to ECC decoding by the ECC engine 191, and the data DQ subjected to the ECC decoding may be provided to the memory controller 10 through the data interface 200.

The data interface 200 may include a clock buffer 210 (e.g. a first buffer), a buffer 220 (e.g. a second buffer), and a data module 230.

The clock buffer 210 may receive the clock signal CLK from the memory controller 10. The clock buffer 210 may divide the clock signal CLK, thereby generating a divided clock signal CLK0.

The buffer 220 may receive the clock signal CLK0 from the clock buffer 210. The buffer 220 may buffer the clock signal CLK0. The buffer 220 may transfer the clock signal CLK0' to the data module 230 accordingly.

The data module 230 may provide the data DQ to the ECC engine 191 on the basis of the clock signal CLK in the writing operation. The data module 230 may provide the memory controller 10 with data DQ provided from the ECC engine 191, on the basis of the clock signal CLK0' provided from the buffer 220 in the reading operation.

Hereinafter, a data interface 200 according to the technical idea of inventive concepts will be described referring to FIGS. 3 to 12.

Figure 3:
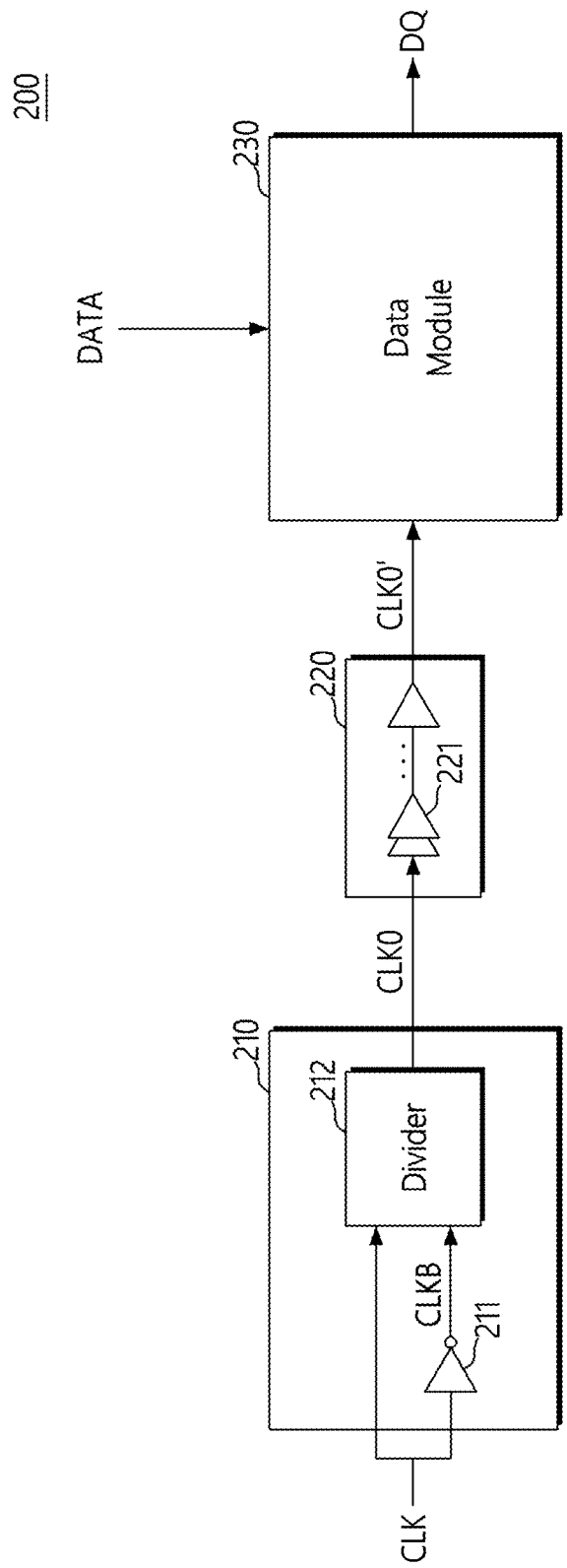
FIG. 3 is a block diagram of a data interface according to some example embodiments.
Figure 4:
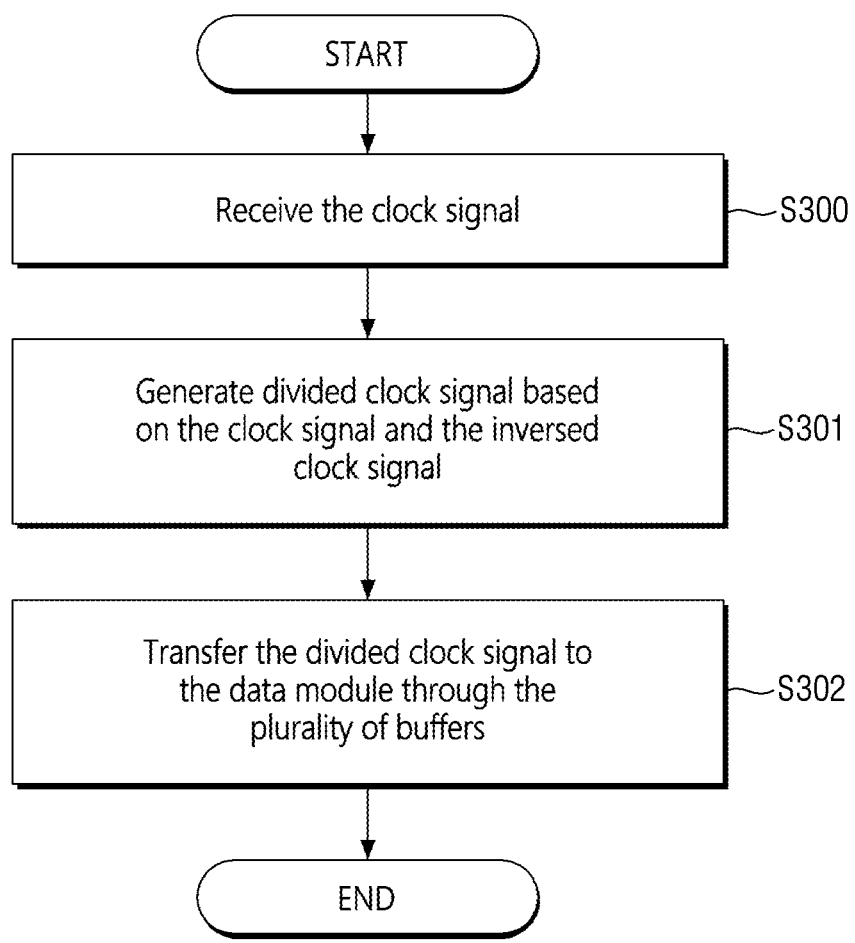
FIG. 4 is a flowchart for explaining the operation of the data interface according to some example embodiments.
Figure 5:
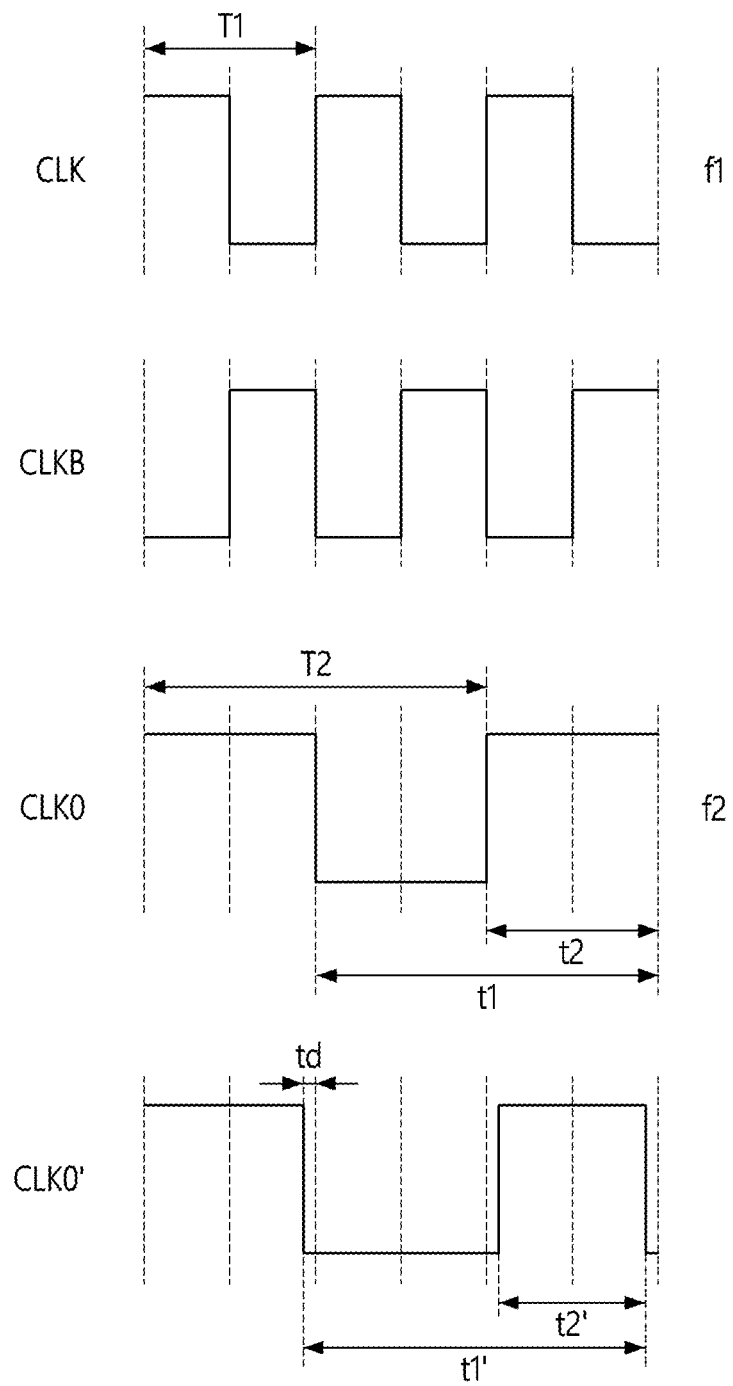
FIG. 5 is a timing diagram for explaining the transmission of clock signals according to some example embodiments.

FIG. 3 is a block diagram of a data interface according to some example embodiments. FIG. 4 is a flowchart for explaining the operation of the data interface according to some example embodiments. FIG. 5 is a timing diagram for explaining the transmission of clock signals according to some example embodiments.

Referring to FIGS. 3 and 4, the data interface 200 may include a clock buffer 210, a buffer 220, and a data module 230. The buffer 220 may directly connect the clock buffer 210 and the data module 230.

The clock buffer 210 may include an inverter 211 and a divider 212. The clock buffer 210 may receive the clock signal CLK from the memory controller 10 (S300). Referring to FIG. 5, a cycle of the received clock signal CLK may be a first cycle T1. A frequency of the clock signal CLK may be a first frequency f1. The first cycle T1 and the first frequency f1 are an example, and the embodiments according to the technical ideas of inventive concepts are not limited thereto.

According to some example embodiments, the clock buffer 210 may not include the inverter 211 and the divider 212. For example, the clock buffer 210 may simply transfer the clock signal CLK to the buffer 220. For example, the clock buffer 210 may not be divided by the divider 212. For example, the clock signal CLK0 which is output from the clock buffer 210 may not have a divided clock signal.

Referring to FIGS. 3 and 4 again, the clock buffer 210 may generate a divided clock signal on the basis of the clock signal CLK and an inverted clock signal CLKB (S301). The inverter 211 may receive the clock signal CLK, and may generate an inverted clock signal CLKB obtained by inverting the clock signal CLK. Referring to FIG. 5, the inverted clock signal CLKB may have a phase inverted, e.g. a phase 180 degrees inverted, from the clock signal CLK.

Referring to FIG. 3 again, the divider 212 may receive the clock signal CLK and the inverted clock signal CLKB. The divider 212 may generate a clock signal CLK0 on the basis of the clock signal CLK and the phase shifted/inverted clock signal CLKB.

Referring to FIG. 5, the cycle of the generated clock signal CLK0 may be a second cycle T2, and the frequency of the clock signal CLK0 may be a second frequency f2. The second cycle T2 of the clock signal CLK0 may be greater than the first cycle T1 of the clock signal CLK. For example, the second cycle T2 of the clock signal CLK0 may be twice the first cycle T1 of the clock signal CLK. Also, the second frequency f2 of the clock signal CLK0 may be less than the first frequency f1 of the clock signal CLK. For example, the first frequency f1 may be twice the second f2. However, the embodiments according to the technical ideas of inventive concepts are not limited thereto. Accordingly, the clock signal CLK0 may have a timing margin greater than the clock signal CLK.

Referring to FIGS. 3 and 4 again, the data interface 200 may transfer the clock signal CLK0 to the data module 230 through a plurality of buffers 221 (S302). The buffer 220 may include a plurality of buffers 221. Each buffer 221 may buffer the transferred clock signal CLK0. For example, if there are n buffers 221, the clock signal CLK0 may be buffered n times. The clock signal CLK0' that is transferred through the plurality of buffers 221 may be output from the buffer 220.

As shown in FIG. 5, the buffered clock signal CLK0' may differ from the clock signal CLK0 before being buffered. In the clock signal CLK0, the cycle of the clock signal CLK0 may be or correspond to a first time t1, and a time interval of a portion in which a logical value is 1 may be or correspond to a second time t2. However, in the buffered clock signal CLK0', the cycle of the clock signal CLK0" may be or correspond to a first time t1', and a time interval of a portion in which the logical value is 1 may be or correspond to a second time t2'.

A ratio of the second time t2 to the first time t1 in the clock signal CLK0 may be 50%. However, a ratio of the second t2' to the first time t1' in the buffered clock signal CLK0' may not be 50%. For example, as the clock signal CLK0 is transferred through the buffer 220, the duty cycle of the output clock signal CLK0' may be changed.

Additionally, the clock signal CLK0' may differ by the delay time td when compared to the clock signal CLK0. For example, the clock signal CLK0' may be further delayed and/or distorted from the clock signal CLK0. However, example embodiments according to the technical idea of inventive concepts are not limited thereto.

Referring to FIG. 3 again, the buffer 220 may provide the clock signal CLK0' to the data module 230. The data module 230 may receive data DATA that is read from the memory cell array 180. The data module 230 may output a data signal DQ including the data DATA in synchronization with the clock signal CLK0', e.g. in synchronization with a rising edge and/or a falling edge of the clock signal CLK0'.

Figure 6:
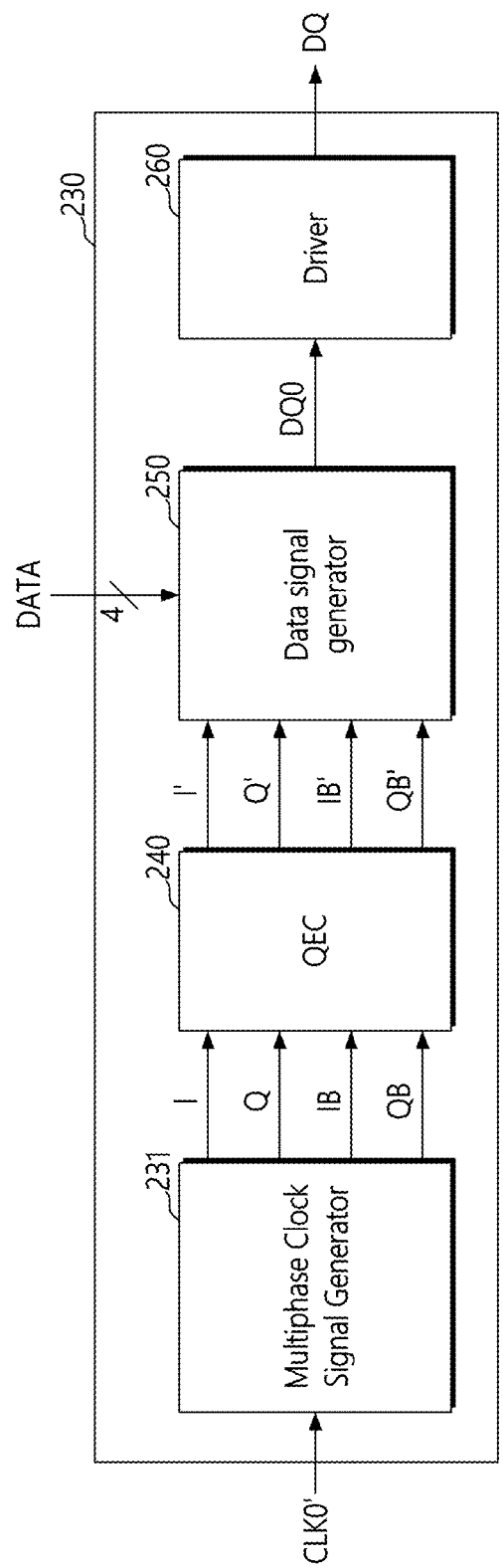
FIG. 6 is a block diagram of a data module according to some example embodiments.
Figure 7:
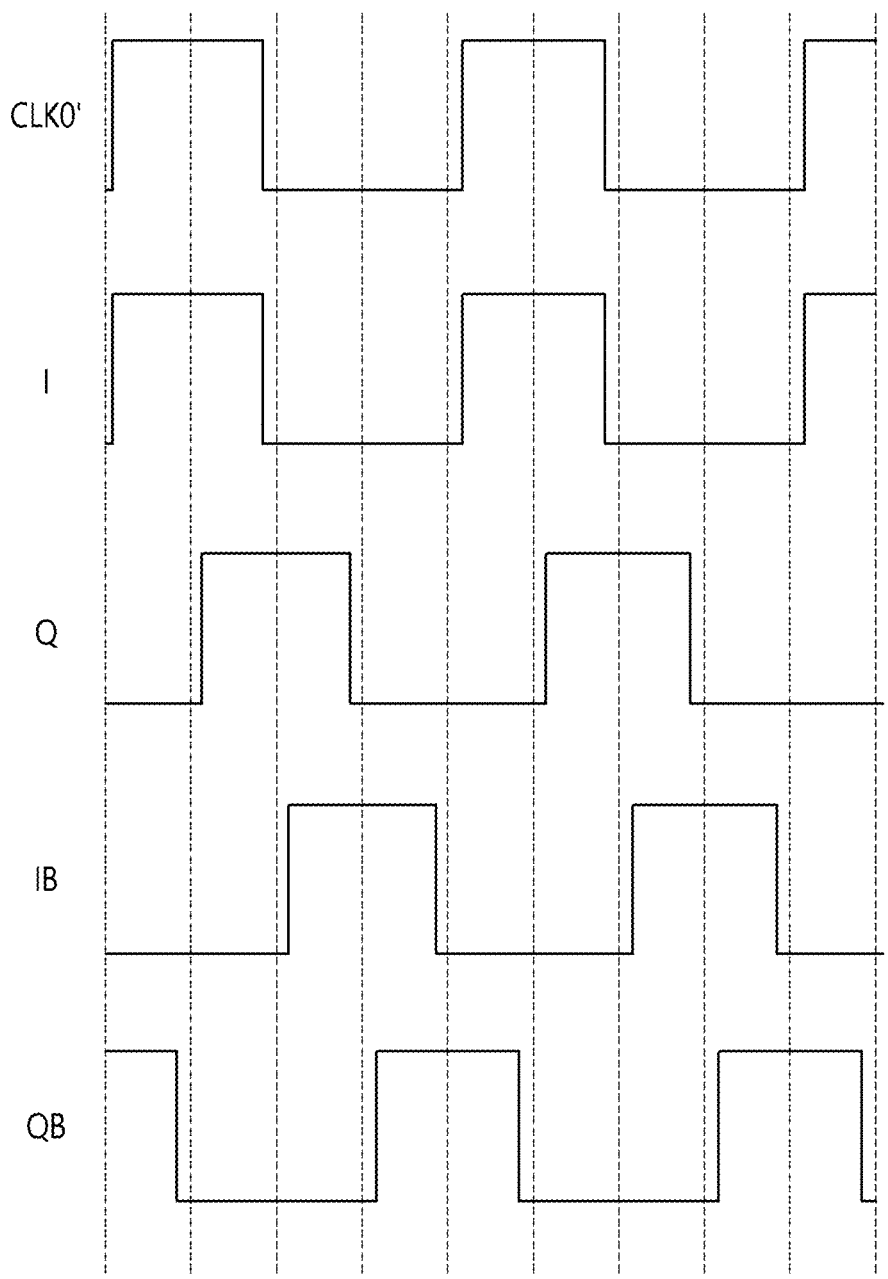
FIG. 7 is a timing diagram for explaining the generation of the clock signal of the data module according to some example embodiments.

FIG. 6 is a block diagram of a data module according to some example embodiments. FIG. 7 is a timing diagram for explaining the generation of the clock signal of the data module according to some example embodiments.

Referring to FIG. 6, the data module 230 may include a multiphase clock signal generator 231, a clock signal correction circuit 240, a data signal generator 250, and a driver 260. The clock signal correction circuit 240 may directly connect the multiphase clock signal generator 231 and the data signal generator 250. However, example embodiments according to the technical ideas of inventive concepts are not limited thereto.

The data module 230 may autonomously generate a plurality of clock signals I, Q, IB, and QB through clock signal generator 231, and correct the plurality of clock signals I, Q, IB, and QB through the clock signal correction circuit 240. For example, the data module 230 may autonomously operate, without being controlled by the control logic circuit 110. Alternatively or additionally, the data module 230 may autonomously operate, without being controlled by the memory controller 10.

The multiphase clock signal generator 231 may receive a clock signal CLK0' from the buffer 220, and may generate a plurality of clock signals having different phases, the different phases on the basis of the provided clock signal CLK0'. For example, the multiphase clock signal generator 231 may generate a first clock signal I, a second clock signal Q, a third clock signal IB, and a fourth clock signal QB having different phases from each other.

Referring to FIG. 7, the first clock signal I, the second clock signal Q, the third clock signal IB, and the fourth clock signal QB may have all different phases from each other, and may or may not have the same frequency with each other. For example, the phase of the first clock signal I may be the same as the phase of the clock signal CLK0'. For example, the phase of the first clock signal I may differ from the phase of the clock signal CLK0' by 0 degree.

The phase of the second clock signal Q may differ from the phase of the clock signal CLK0' by 90 degrees. The phase of the third clock signal IB may differ from the phase of the clock signal CLK0' by 180 degrees. The phase of the fourth clock signal QB may differ from the phase of the clock signal CLK0' by 270 degrees. That is, phases of the first to fourth clock signals I, Q, IB, and QB may differ from each other by about 90 degrees.

Additionally, the first to fourth clock signals I, Q, IB, and QB may have the characteristics of the clock signal CLK0'. For example, the first to fourth clock signals I, Q, IB, and QB may be delayed by a delay time td, and/or the duty cycle of the first to fourth clock signals I, Q, IB, and QB may not be 50%. However, example embodiments according to the technical ideas of inventive concepts are not limited thereto.

Referring to FIG. 6 again, the clock signal correction circuit 240 may receive the first to fourth clock signals I, Q, IB, and QB. The clock signal correction circuit 240 may correct the provided first to fourth clock signals I, Q, IB, and QB, thereby outputting the first to fourth clock signals I', Q', IB' and QB'.

Figure 8:
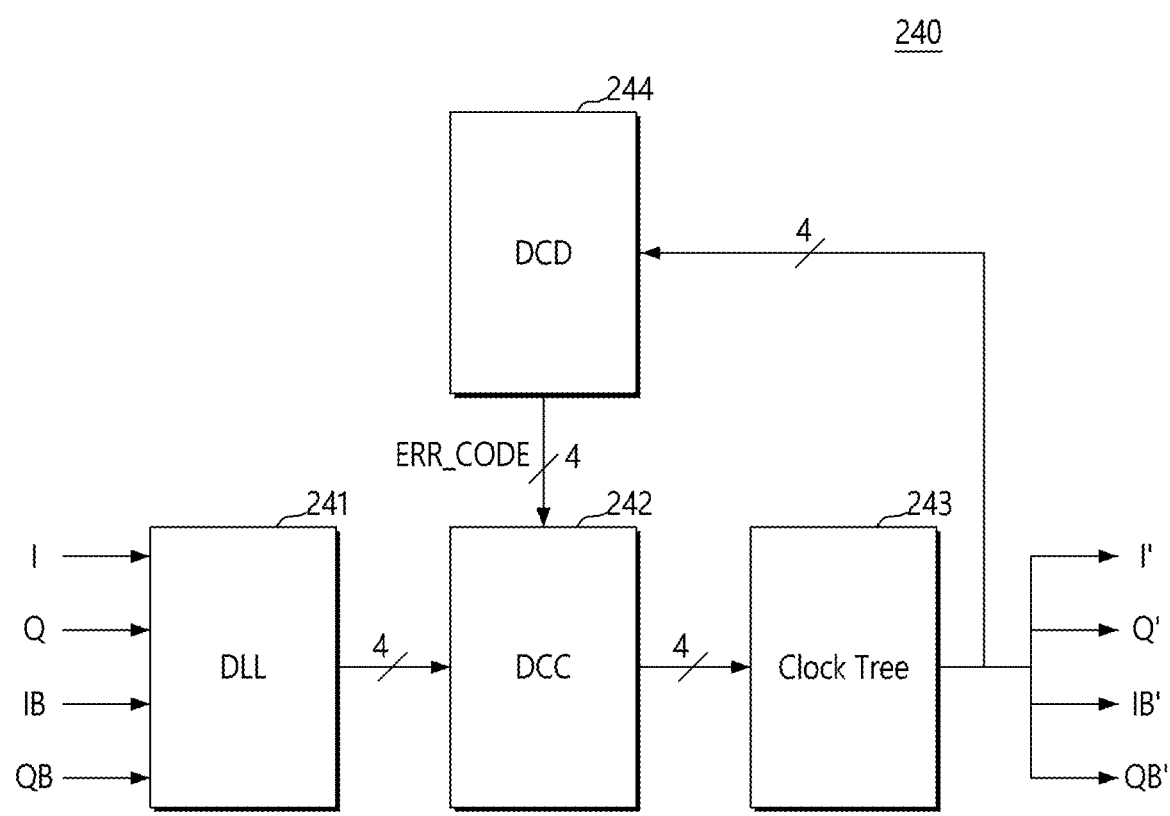
FIG. 8 is a block diagram of the clock signal correction circuit according to some example embodiments.
Figure 9:
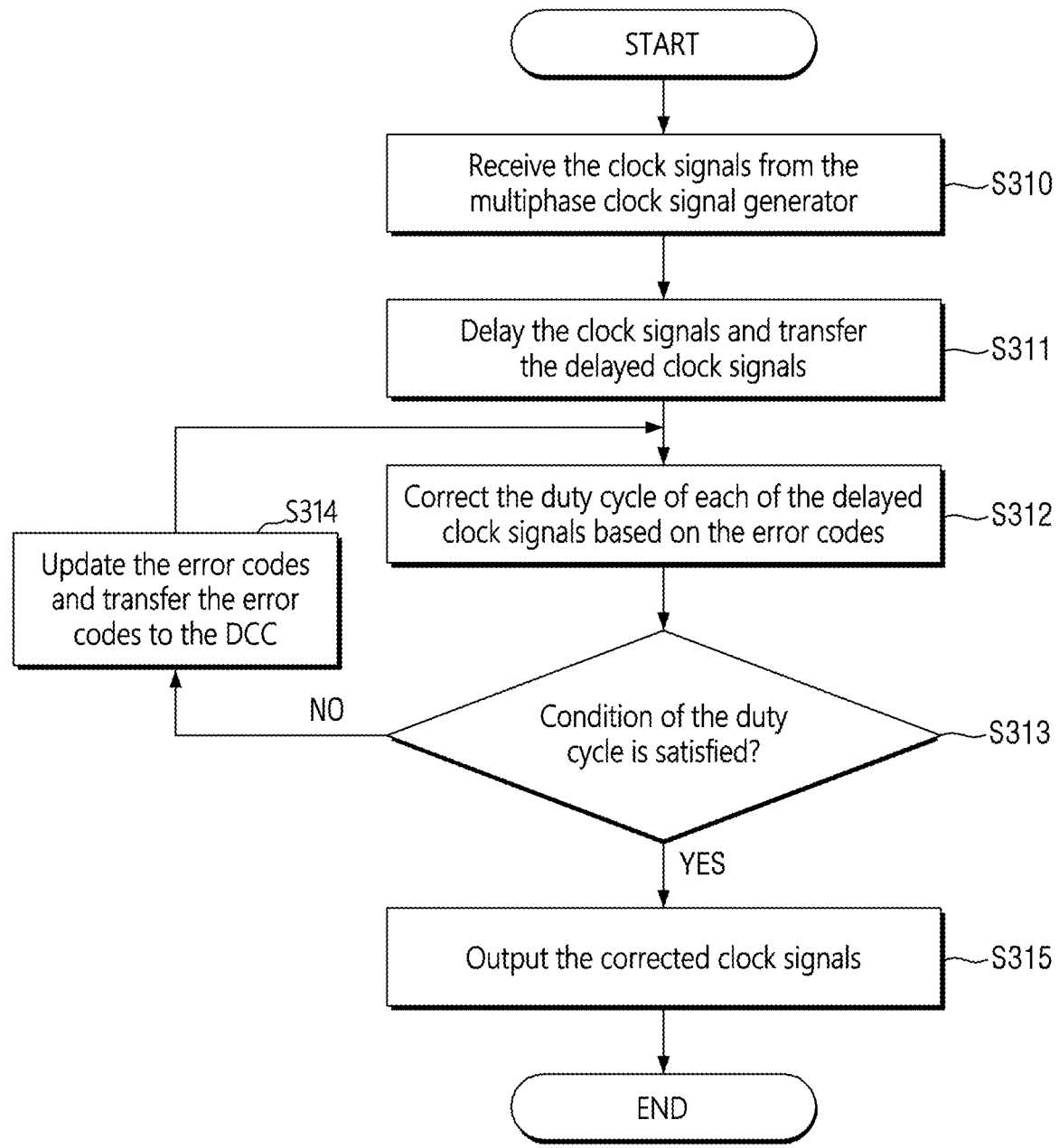
FIG. 9 is a flowchart for explaining the operation of the clock signal correction circuit of FIG. 8.
Figure 10:
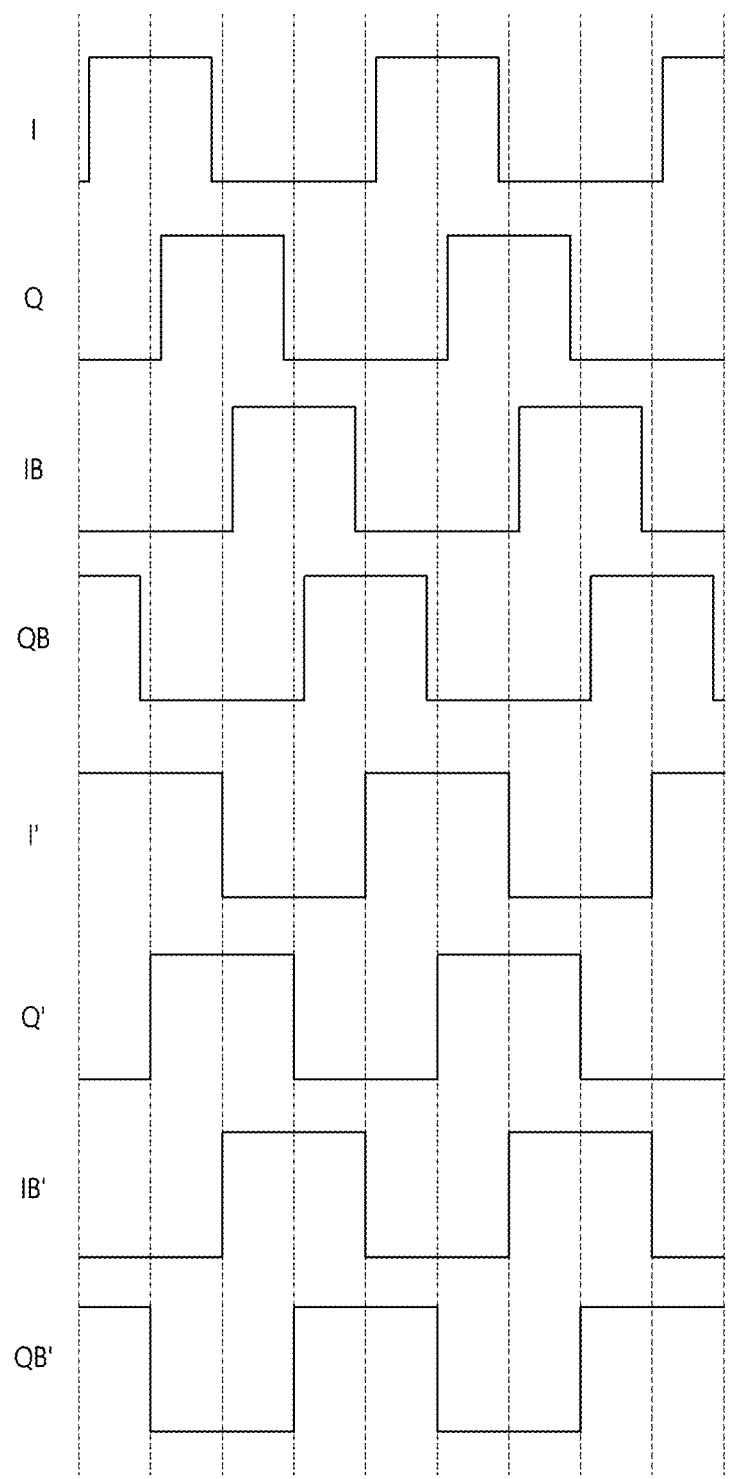
FIG. 10 is a timing diagram for explaining the operation of the clock signal correction circuit of FIG. 8.

FIG. 8 is a block diagram of the clock signal correction circuit according to some example embodiments. FIG. 9 is a flowchart for explaining the operation of the clock signal correction circuit of FIG. 8. FIG. 10 is a timing diagram for explaining the operation of the clock signal correction circuit of FIG. 8.

Referring to FIGS. 8 and 9, the clock signal correction circuit 240 may include a delay locked loop circuit 241, a duty cycle correction circuit 242, a clock tree 243, and a duty cycle detection circuit 244.

The delay locked loop circuit 241 may receive the first to fourth clock signals I, Q, IB, and QB from the multiphase clock signal generator 231 (S310).

The delay locked loop circuit 241 may delay the first to fourth clock signals I, Q, IB, and QB, and may transfer the delayed first to fourth clock signals I, Q, IB, and QB (S311). The delay locked loop circuit 241 may delay the first to fourth clock signals I, Q, IB, and QB to correct a clock skew between the first to fourth clock signals I, Q, IB, and QB. For example, the phase difference between the first to fourth clock signals I, Q, IB, and QB may need to be or may be 90 degrees, e.g. 90 degrees between the first and second clock signals I and Q, 90 degrees between the second and third clock signals Q and IB, and 90 degrees between the third and fourth clock signals IB and QB. However, if the phase difference between the first to fourth clock signals I, Q, IB, and QB is not 90 degrees, the delay locked loop circuit 241 may delay the first to fourth clock signals I, Q, IB, and QB so that a difference in each phase of the first to fourth clock signals I, Q, IB, and QB is 90 degrees. For example, the delay locked loop circuit 241 may lock the first to fourth clock signals I, Q, IB, and QB.

The duty cycle correction circuit 242 may receive the first to fourth clock signals I, Q, IB, and QB. For example, the duty cycle correction circuit 242 may receive the first to fourth clock signals I, Q, IB, and QB locked by the delay locked loop circuit 241.

The duty cycle correction circuit 242 may correct the duty cycle of each of the delayed first to fourth clock signals I, Q, IB, and QB on the basis of an error code ERR_CODE (S312). The duty cycle correction circuit 242 may correct the duty cycle of the first to fourth clock signals I, Q, IB, and QB in response to the error code ERR_CODE. For example, the duty cycle of the first to fourth clock signals I, Q, IB, and QB which are output from the delay locked loop circuit 241 may not be optimal or may be improved/improvable. The duty cycle of the clock signal may be desirable when it is 50%. For example, the duty cycle of the first to fourth clock signals I, Q, IB, and QB before correction may be greater than or less than 50%. In this case, the duty cycle correction circuit 242 may correct the duty cycle of the first to fourth clock signals I, Q, IB, and QB so that the duty cycle of the first to fourth clock signals I, Q, IB, and QB is in an improved state, e.g. in the optimum state.

The error code ERR_CODE may be or may include information about whether to correct the duty cycle of the first to fourth clock signals I, Q, IB, and QB. For example, when the duty cycle of the first to fourth clock signals I, Q, IB, and QB is 40%, the error code ERR_CODE may correspond to information that increases the duty cycle of the first to fourth clock signals I, Q, IB, QB by 10%. The duty cycle correction circuit 242 may provide the clock tree 243 with the first to fourth clock signals I, Q, IB, and QB in which the duty cycle is corrected.

The clock tree 243 may receive the first to fourth clock signals I, Q, IB, and QB corrected by the duty cycle correction circuit 242, and may provide them to the duty cycle detection circuit 244 and the data signal generator 250. For example, the clock tree 243 may provide the first to fourth clock signals I', Q', IB', and QB' to the data signal generator 250.

The duty cycle detection circuit 244 may generate an error code ERR_CODE including whether to correct the duty cycle of the first to fourth clock signals I, Q, IB, and QB on the basis of the first to fourth clock signals I', Q', IB', and QB'. The duty cycle detection circuit 244 may provide the error code ERR_CODE to the duty cycle correction circuit 242 to perform a feedback.

The duty cycle detection circuit 244 may determine whether the conditions of the duty cycle of the first to fourth clock signals I', Q', IB', and QB' satisfy a standard (S313). If the conditions of the duty cycle of the first to fourth clock signals I', Q', IB', and QB' do not satisfy the standard (S313—NO), the duty cycle detection circuit 244 may update the error code ERR_CODE and may transfer the updated error code ERR_CODE to the duty cycle correction circuit 242 (S314). Alternatively, if the conditions of the duty cycle of the first to fourth clock signals I', Q', IB', and QB' satisfy the standard (S313—YES), the duty cycle detection circuit 244 may output the corrected first to fourth clock signals I', Q', IB', and QB' (S315).

Referring to FIG. 10, the first to fourth clock signals I, Q, IB, and QB may be corrected to become the first to fourth clock signals I', Q', IB', and QB'. For example, the first to fourth clock signals I, Q, IB, and QB before correction may have a clock skew each other, and the duty cycle of any or all of the first to fourth clock signals I, Q, IB, and QB may not be 50%.

However, the first to fourth clock signals I', Q', IB', and QB' corrected through the clock signal correction circuit 240 may have no clock skew each other, and the duty cycle of the first to fourth clock signals I', Q', IB', and QB' may be 50%. However, example embodiments according to the technical ideas of inventive concepts are not limited thereto.

The clock signal CLK0 having one phase is transferred via the buffer 220, and the first to fourth clock signals I, Q, IB, and QB having a plurality of phases are generated in/within the data module 230d and corrected through the clock signal correction circuit 240. If clock signals having a plurality of phases are transferred via the buffer 220 as clock signals having the plurality of phases, a clock skew between the clock signals occurs, and/or a duty cycle distortion of each clock signal may occur. However, if only the clock signal CLK0 having one phase is transmitted, and the first to fourth clock signals I, Q, IB, and QB having a plurality of phases are generated in/within the data module 230 and are corrected in/within the data module 230, the clock skew between the clock signals may be reduced and the duty cycle distortion may also be reduced.

Referring to FIG. 6 again, the data signal generator 250 may receive the corrected first to fourth clock signals I', Q', IB', and QB'. Also, the data signal generator 250 may receive the data DATA that is read from the memory cell array 180. Here, the data DATA may be data provided in parallel. For example, the data DATA may be data that are not provided in a time sequence.

Figure 11:
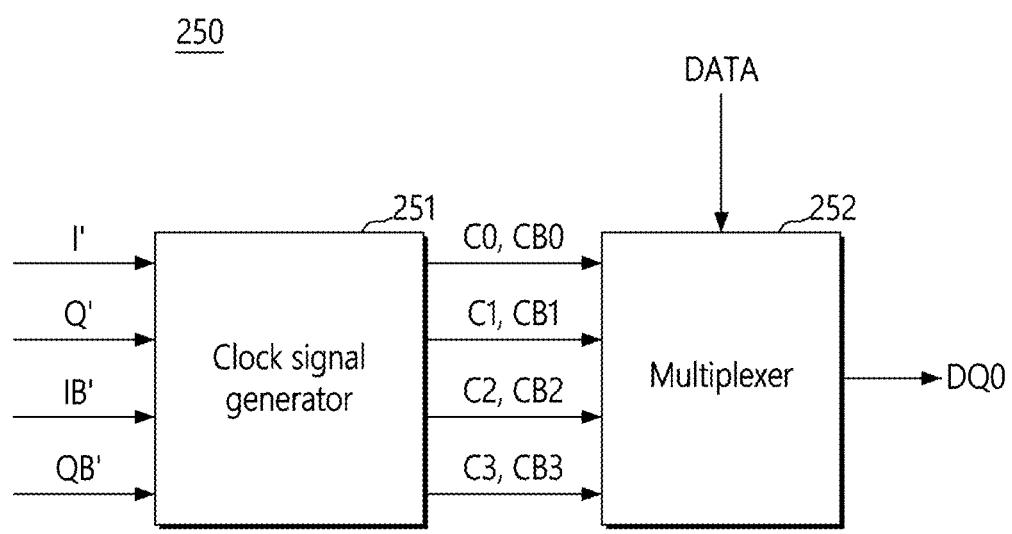
FIG. 11 is a block diagram of a data signal generator according to some example embodiments.
Figure 12:
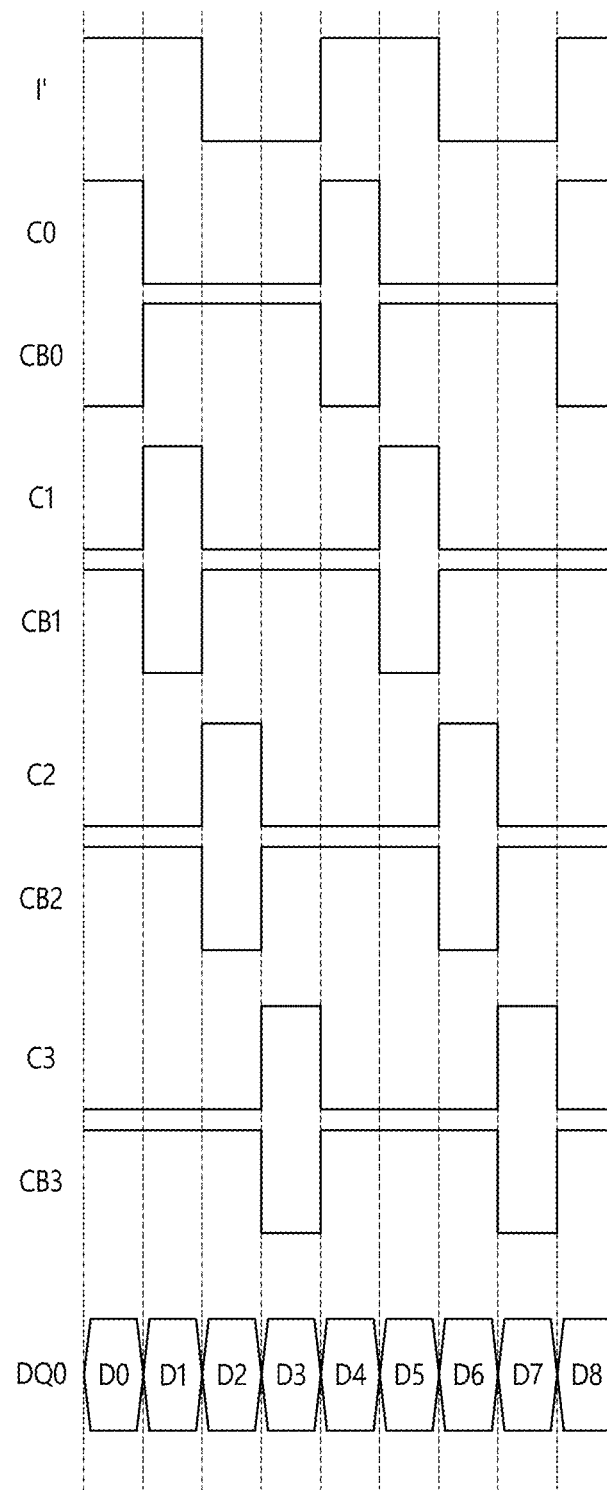
FIG. 12 is a timing diagram for explaining the operation of the data signal generator of FIG. 11.

FIG. 11 is a block diagram of a data signal generator according to some example embodiments. FIG. 12 is a timing diagram for explaining the operation of the data signal generator of FIG. 11.

Referring to FIG. 11, the data signal generator 250 may include a clock signal generator 251 and a multiplexer 252. The clock signal generator 251 may receive the corrected first to fourth clock signals I', Q', IB', and QB'. The clock signal generator 251 may generate a first clock signal C0, a first inverted clock signal CB0, a second clock signal C1, a second inverted clock signal CB1, a third clock signal C2, a third inverted clock signal CB2, a fourth clock signal C3, and a fourth inverted clock signal CB3, on the basis of the corrected first to fourth clock signals I', Q', IB', and QB'.

Referring to FIG. 12, the first clock signal C0 and the first inverted clock signal CB0 may be transferred in a first unit interval section. Additionally, the second clock signal C1 and the second inverted clock signal CB1 may be transferred in a second unit interval section. The third clock signal C2 and the third inverted clock signal CB2 may be transferred in a third unit interval section. Additionally, the fourth clock signal C3 and the fourth inverted clock signal CB3 may be transferred in a fourth unit interval section.

For example, in all the unit interval sections, the first clock signal C0, the first inverted clock signal CB0, the second clock signal C1, the second inverted clock signal CB1, the third clock signal C2, the third inverted clock signal CB2, the fourth clock signal C3, and the fourth inverted clock signal CB3 may be transferred. The clock signal generator 251 may provide the multiplexer 252 with the generated first clock signal C0, first inverted clock signal CB0, second clock signal C1, second inverted clock signal CB1, third clock signal C2, third inverted clock signal CB2, fourth clock signal C3, and fourth inverted clock signal CB3.

Referring to FIG. 11 again, the multiplexer 252 may receive the data DATA, the first clock signal C0, the first inverted clock signal CB0, the second clock signal C1, the second inverted clock signal CB1, the third clock signal C2, the third inverted clock signal CB2, the fourth clock signal C3, and the fourth inverted clock signal CB3. Additionally, the multiplexer 252 may also generate the data signal DQ0 based on the received data DATA and/or the received clock signals C0-C3/inverted clock signals CB0-CB3.

Referring to FIG. 12, the first data D0, the fifth data D4 and the ninth data D8 may be transferred in synchronization with (e.g. based on a rising edge and/or a falling edge of) the first clock signal C0 and the first inverted clock signal CB0. The second data D1 and the sixth data D5 may be transferred in synchronization with (e.g. based on a rising edge and/or a falling edge of) the second clock signal C1 and the second inverted clock signal CB1. The third data D2 and the seventh data D6 may be transferred in synchronization with (e.g. based on a rising edge and/or a falling edge of) the third clock signal C2 and the third inverted clock signal CB2. The fourth data D3 and the eighth data D4 may be transferred in synchronization with (e.g. based on a rising edge and/or a falling edge of) the fourth clock signal C3 and the fourth inverted clock signal CB3.

For example, the first to ninth data D0, D1, D2, D3, D4, D5, D6, D7, and D8, which are parallel type, may be synchronized with the first clock signal C0, the first inverted clock signal CB0, the second clock signal C1, the second inverted clock signal CB1, the third clock signal C2, the third inverted clock signal CB2, the fourth clock signal C3, and the fourth inverted clock signal CB3. The data signal DQ0 may be generated accordingly.

Referring to FIG. 6 again, the data signal generator 250 may provide the data signal DQ0 to the driver 260. The driver 260 may output the data signal DQ. For example, the data module 230 may output the data signal DQ.

Since the multiphase clock signal generator 231 that drives the clock signal CLK0' into the clock signals having a plurality of phases is located in/within the data module 230, there is no need to or requirement to or expectation to buffer the clock signals having the plurality of phases, and the power used by the memory device 100 can be reduced. Additionally or alternatively, since the clock signal CLK0' having one phase is buffered and transferred, and the clock signal CLK0' is processed by the multiphase clock signal generator 231 of the data module 230 and the clock signal correction circuit 240, the reliability of the first to fourth clock signals I', Q', IB', and QB' can be improved.

Hereinafter, a data module 230 according to some example embodiments will be described referring to FIGS. 13 and 14.

Figure 13:
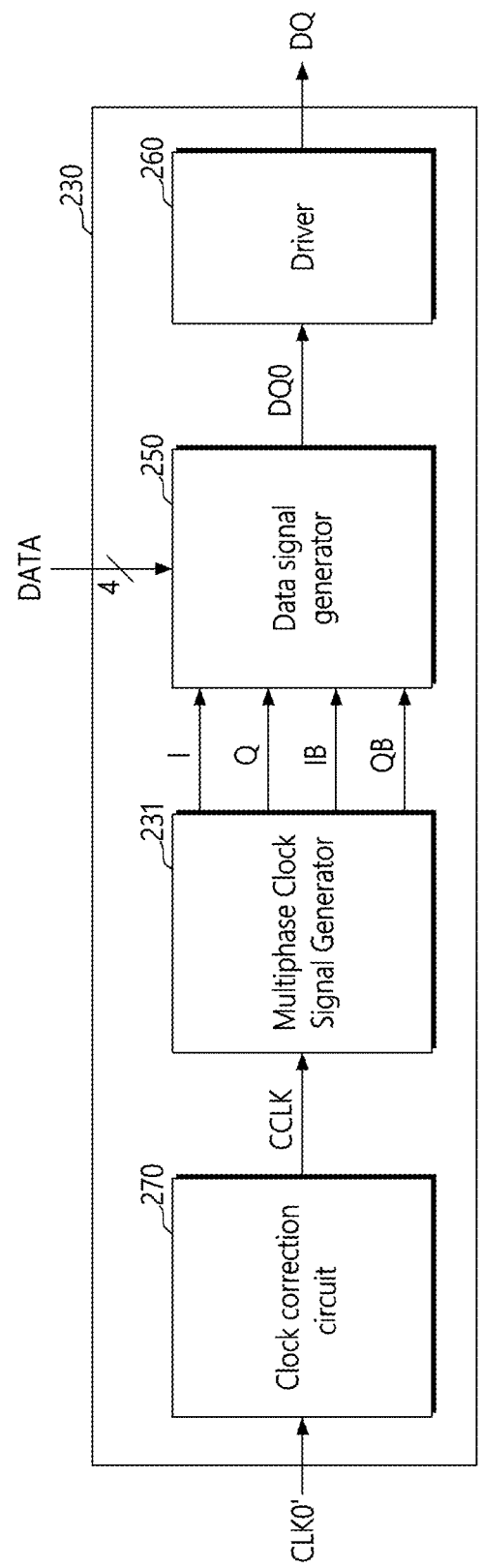
FIG. 13 is a block diagram of a data module according to some example embodiments.

FIG. 13 is a block diagram of a data module according to some example embodiments. FIG. 14 is a timing diagram for explaining the operation of the data module of FIG. 13. For convenience of explanation, repeated parts of contents explained using FIGS. 1 to 12 will be briefly explained or omitted.

Referring to FIG. 13, the data module 230 may further include a clock signal correction circuit 270. Instead, the data module 230 may not include the clock signal correction circuit 240.

The clock signal correction circuit 270 may be directly connected to the buffer 220 and may be directly connected to the multiphase clock signal generator 231. The clock signal correction circuit 270 may be connected between the buffer 220 and the multiphase clock signal generator 231.

The clock signal correction circuit 270 may receive the clock signal CLK0'. For example, the clock signal correction circuit 270 may receive the clock signal CLK0' having one phase.

Figure 14:
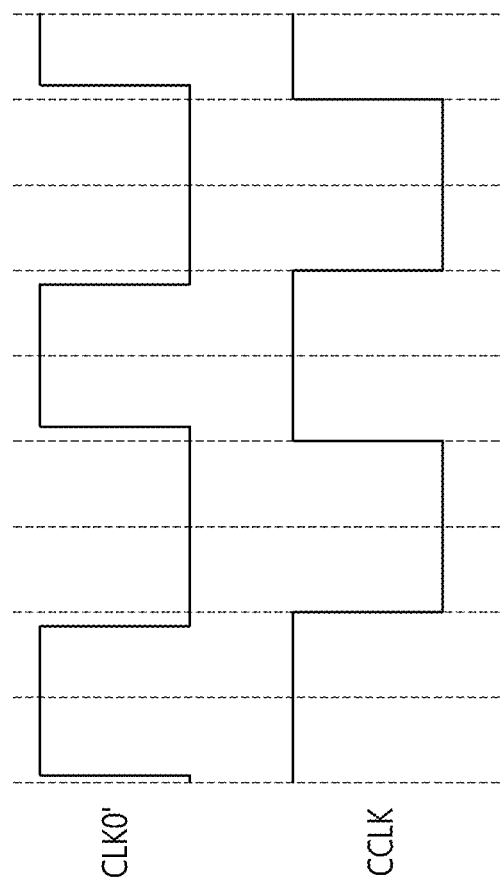
FIG. 14 is a timing diagram for explaining the operation of the data module of FIG. 13.

Referring to FIG. 14, the clock signal correction circuit 270 may correct the clock signal CLK0' and output the corrected clock signal CCLK. For example, the clock signal correction circuit 270 may correct the duty cycle of the clock signal CLK0' having one phase.

The correction clock signal CCLK is transferred to the multiphase clock signal generator 231, and the multiphase clock signal generator 231 may generate the first to fourth clock signals I, Q, IB, and QB having different phases in response to this. That is, by first correcting the clock signal CLK0' having one phase, the data module 230 may correct the clock signal CLK0' using less power and generate first to fourth clock signals I, Q, IB, and QB having a plurality of phases.

Hereinafter, a data interface 200a according to some example embodiments will be described referring to FIG. 15.

Figure 15:
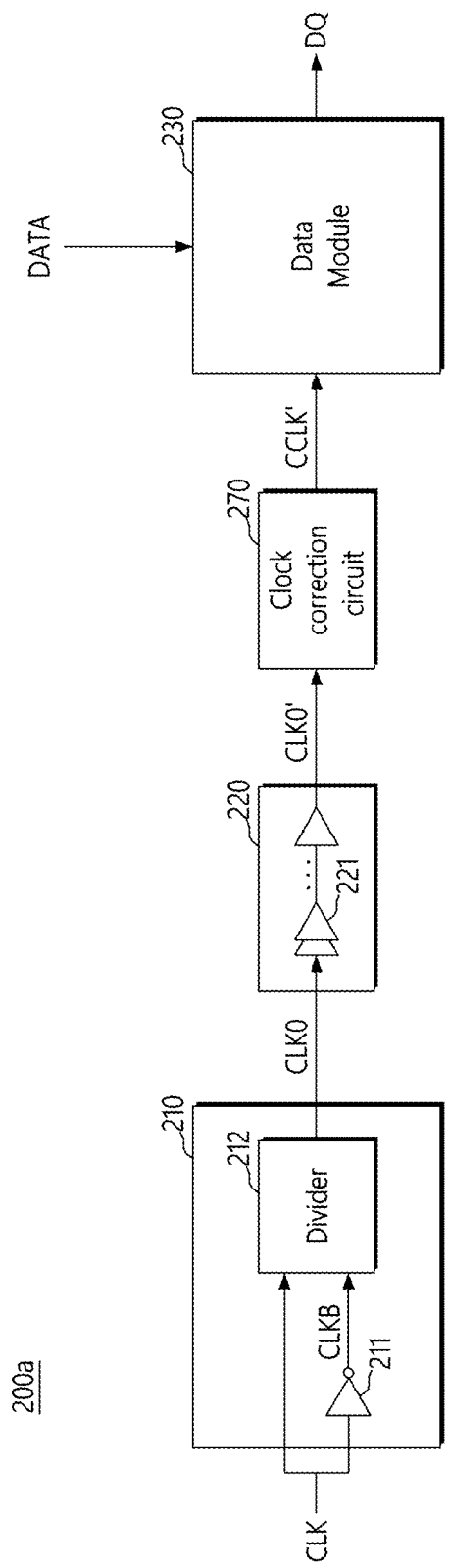
FIG. 15 is a block diagram of the data interface according to some example embodiments.

FIG. 15 is a block diagram of the data interface according to some example embodiments. For convenience of explanation, repeated parts of contents explained using FIGS. 1 to 12 will be briefly explained or omitted.

Referring to FIG. 15, the data interface 200a may further include a clock signal correction circuit 270. The clock signal correction circuit 270 may be directly connected to the buffer 220 and the data module 230. The clock signal correction circuit 270 may be connected between the buffer 220 and the data module 230. The clock signal correction circuit 270 receives the clock signal CLK0' from the buffer 220, and may output the correction clock signal CCLK in response to the clock signal CLK0'. The clock signal correction circuit 270 may provide the correction clock signal CCLK to the data module 230.

The clock signal correction circuit 270 may be separated from the data module 230. For example, the clock signal correction circuit 270 may be placed outside the data module 230. The clock signal correction circuit 270 may correct the clock signal CLK0' distorted by buffering of the buffer 220, by correcting the duty cycle of the clock signal CLK0' having one phase.

The data module 230 may receive the correction clock signal CCLK' and output a data signal DQ in synchronization with the correction clock signal CCLK'. Here, the data module 230 may not include the clock signal correction circuit 270 or the clock signal correction circuit 240 inside. That is, before the clock signal is transferred to the data module 230, since the clock signal CLK0' is corrected by the clock signal correction circuit 270 outside the data module 230, the data module 230 may not correct the correction clock signal CCLK'. However, the embodiments according to the technical ideas of inventive concepts are not limited thereto. For example, the data module 230 may include the clock signal correction circuit 270 or the clock signal correction circuit 240 inside.

Hereinafter, a data interface 200b according to some example embodiments will be described referring to FIG. 16.

Figure 16:
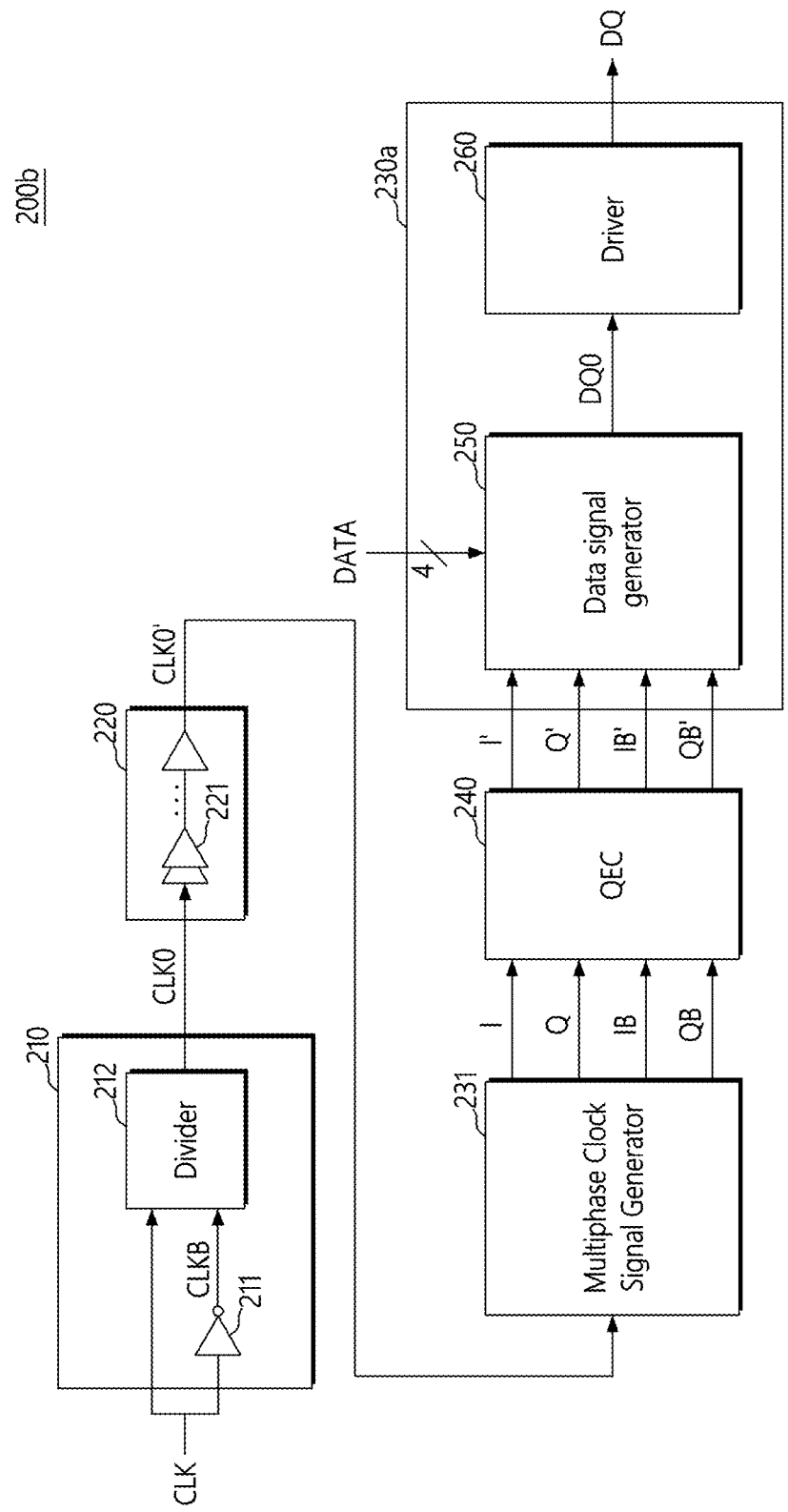
FIG. 16 is a block diagram of a data interface according to some example embodiments.

FIG. 16 is a block diagram of a data interface according to some example embodiments. For convenience of explanation, repeated parts of contents explained using FIGS. 1 to 12 will be briefly explained or omitted.

Referring to FIG. 16, the data interface 200b may include a multiphase clock signal generator 231 and a clock signal correction circuit 240 placed outside the data module 230a. For example, in the data interface 200 described referring to FIGS. 1 to 12, unlike the configuration in which the data module 230 includes the multiphase clock signal generator 231 and the clock signal correction circuit 240, the data module 230a may not include the multiphase clock signal generator 231 and the clock signal correction circuit 240 inside.

The multiphase clock signal generator 231 and the clock signal correction circuit 240 may be placed between the buffer 220 and the data module 230a, and connect the buffer 220 and the data module 230a.

The multiphase clock signal generator 231 may receive the clock signal CLK0', and output the first clock signal I, the second clock signal Q, the third clock signal IB, and the fourth clock signal QB having a plurality of phases, in response to the clock signal CLK0'. The clock signal correction circuit 240 may provide the data module 240a with the first clock signal I', the second clock signal Q', the third clock signal IB', and the fourth clock signal QB' obtained by correcting the first clock signal I, the second clock signal Q, the third clock signal IB, and the fourth clock signal QB.

The data module 230a may be synchronized with the first clock signal I', the second clock signal Q', the third clock signal IB', and the fourth clock signal QB' provided from outside to output the data signal DQ.

Hereinafter, a data interface 200c according to some example embodiments will be described referring to FIG. 17.

Figure 17:
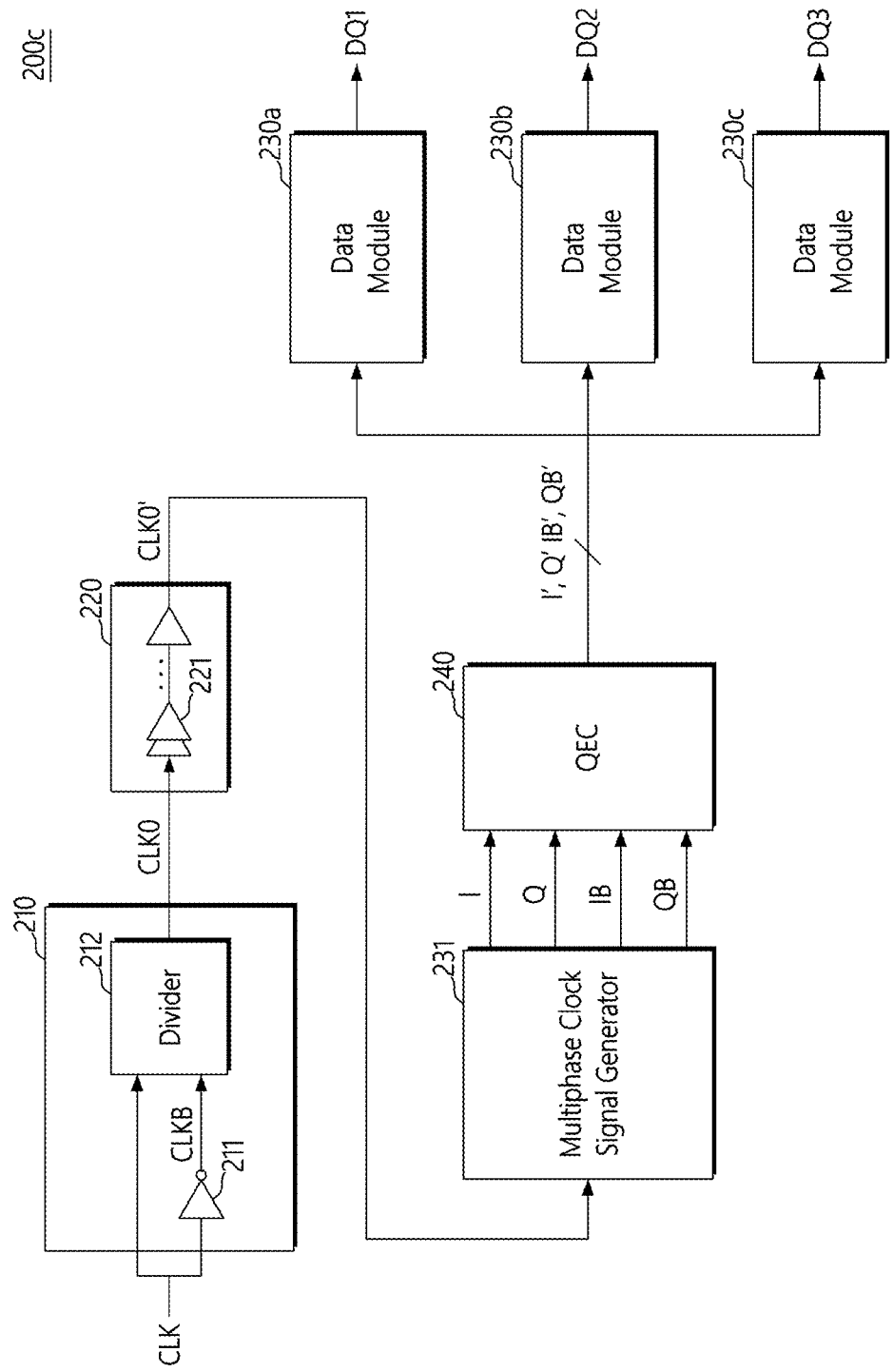
FIG. 17 is a block diagram of a data interface according to some example embodiments.

FIG. 17 is a block diagram of a data interface according to some example embodiments. For convenience of explanation, repeated parts of contents explained using FIGS. 1 to 12 and 16 will be briefly described or omitted.

Referring to FIG. 17, the data interface 200c may include a plurality of data modules. That is, the data interface 200c may include a data module 230a, a data module 230b, and a data module 230c. The data module 230a, the data module 230b, and the data module 230c may receive the first to fourth clock signals I', Q', IB', and QB' provided from the clock signal correction circuit 240.

A multiphase clock signal generator 231 and a clock signal correction circuit 240 may be located outside the data module 230a, the data module 230b, and the data module 230c. For example, generation of the clock signal and correction of the clock signal having a plurality of phases are not performed inside the plurality of separate data modules 230a, 230b and 230c, but generation of the clock signal and correction of the clock signal having a plurality of phases are performed outside the plurality of data modules 230a, 230b, and 230c. Thus, the power used by the memory device 100 may be reduced.

Any of the elements disclosed above may include or be implemented in processing circuitry such as hardware including logic circuits; a hardware/software combination such as a processor executing software; or a combination thereof. For example, the processing circuitry more specifically may include, but is not limited to, a central processing unit (CPU), an arithmetic logic unit (ALU), a digital signal processor, a microcomputer, a field programmable gate array (FPGA), a System-on-Chip (SoC), a programmable logic unit, a microprocessor, application-specific integrated circuit (ASIC), etc. Processing circuitry may include active components such as transistors and/or diodes, and/or may include passive components such as resistors, capacitors, inductors, and/or memristors. Processing circuitry may include operational amplifiers and/or phase comparators and/or voltage controlled oscillators.

In concluding the detailed description, those of ordinary skill in the art will appreciate that many variations and modifications may be made to example embodiments without substantially departing from the principles of inventive concepts. Therefore, example embodiments of inventive concepts are used in a generic and descriptive sense only and not for purposes of limitation.

What is claimed is:

1. A memory device comprising:
    a first buffer configured to receive an external clock signal and to generate an internal clock signal on the basis of the external clock signal;
    a second buffer including a plurality of sub-buffers and configured to receive the internal clock signal from the first buffer and to generate a buffered internal clock signal having one-phase; and
    a plurality of processing circuitries configured to receive the buffered internal clock signal from the second buffer,
    wherein the plurality of processing circuitries are configured to execute machine-readable instructions, and the plurality of processing circuitries include,
    (A) a clock signal generator processing circuitry configure to receive the buffered internal clock signal from the second buffer,
    the clock signal generator processing circuitry configured to generate a first internal clock signal, a second internal clock signal, a third internal clock signal, and a fourth internal clock signal, each of the first through fourth internal clock signals having different phases, each of the first through fourth internal clock signals generated on the basis of the buffered internal clock signal, and
    (B) a clock signal correction circuitry configured to correct the first to fourth internal clock signals,
    (C) a first data signal generator processing circuitry,
    wherein the first data signal generator processing circuitry configured to generate a first data signal on the basis of first data and the corrected first internal clock signal,
    the first data signal generator processing circuitry configured to generate a second data signal on the basis of second data and the corrected second internal clock signal,
    the first data signal generator processing circuitry configured to generate a third data signal on the basis of third data and the third internal clock signal, and
    the first data signal generator processing circuitry configured to generate a fourth data signal on the basis of fourth data and the corrected fourth internal clock signal.

2. The memory device of claim 1, wherein the second buffer includes
    a first sub-buffer configured to receive and buffer the internal clock signal; and
    a second sub-buffer configured to receive, buffer the first-buffered internal clock signal from the first sub-buffer, and output the second-buffered internal clock signal.

3. The memory device of claim 2, wherein the first and second sub-buffers directly connect the first buffer and the processing circuitry.

4. The memory device of claim 1, wherein a cycle of the external clock signal is shorter than a cycle of the generated internal clock signal.

5. The memory device of claim 1, wherein the correcting the first to fourth internal clock signals is configured to correct clock skew and a duty cycle of the first to fourth internal clock signals.

6. The memory device of claim 5, wherein the clock signal correction circuitry directly connected between the clock signal generator processing circuitry and the first data signal generator processing circuitry.

7. The memory device of claim 1, wherein the first data signal processing circuitry is configured to
    generate a fifth data signal on the basis of fifth data and the first internal clock signal, generate a sixth data signal on the basis of sixth data and the second internal clock signal, generate a seventh data signal on the basis of seventh data and the third internal clock signal, generate an eighth data signal on the basis of eighth data and the fourth internal clock signal, and output the generated fifth to eighth data signal.

8. The memory device of claim 7, wherein each of the plurality of processing circuitries includes a second data signal generator circuitry separate from the first data signal generator circuitry.

9. The memory device of claim 1, wherein a phase difference between the first internal clock signal and the third internal clock signal is 180 degrees, and
    a phase difference between the second internal clock signal and the fourth internal clock signal is 180 degrees.

10. The memory device of claim 9, wherein the phase difference between the first internal clock signal and the second internal clock signal is 90 degrees.

11. A method of operating a memory device, the method comprising:
    receiving an external clock signal from a memory controller circuitry;
    generating an internal clock signal on the basis of the external clock signal;
    buffering the generated internal clock signal having one phase;
    correcting the buffered internal clock signal;
    transferring the corrected internal clock signal to a plurality of data module circuitries controlled by the memory controller circuitry;
    in each of the data module circuitries, generating a first internal clock signal, a second internal clock signal, a third internal clock signal, and a fourth internal clock signal having different phases from each other, on the basis of the corrected internal clock signal;

generating a first data signal on the basis of first data and the generated first internal clock signal;
generating a second data signal on the basis of second data and the generated second internal clock signal;
generating a third data signal on the basis of third data and the generated third internal clock signal;
generating a fourth data signal on the basis of fourth data and the generated fourth internal clock signal; and
outputting the generated first to fourth data signals.

12. The method of operating the memory device of claim 11, wherein the correcting the buffered internal clock signal is configured to
correct a duty cycle of the buffered internal clock signal.

13. The method of operating the memory device of claim 11, wherein a phase difference between the first internal clock signal and the third internal clock signal is 180 degrees, and
a phase difference between the second internal clock signal and the fourth internal clock signal is 180 degrees.

14. The method of operating the memory device of claim 11, further comprising:
generating a fifth data signal on the basis of fifth data and the generated first internal clock signal;
generating a sixth data signal on the basis of sixth data and the generated second internal clock signal;
generating a seventh data signal on the basis of seventh data and the generated third internal clock signal;
generating an eighth data signal on the basis of eighth data and the generated fourth internal clock signal; and
outputting the generated fifth to eighth data signals.

15. A memory system comprising:
a memory controller circuitry configured to output a clock signal externally; and
a memory device which is connected to the memory controller circuitry and is configured to receive the external clock signal from the memory controller circuitry,
wherein the memory device includes,
a plurality of memory cell arrays including a plurality of memory cells,
a plurality of processing circuitries connected between each the memory cell array and the memory controller circuitry,
a first buffer configured to receive the external clock signal from the memory controller circuitry and to generate a buffered internal clock signal on the basis of the external clock signal, and
a plurality of second buffers configured to receive the buffered internal clock signal from the first buffer and to provide the buffered internal clock signal having one phase to the plurality of processing circuitries, and
the plurality of processing circuitries includes,
(A) a clock signal generating processing circuitry configured to receive the buffered internal clock signal having one phase,
the clock signal generating processing circuitry configured to generate first to fourth internal clock signals having different phases from each other on the basis of the buffered internal clock signal,
(B) a clock signal correction circuitry configured to receive the first to fourth internal clock signals and
to correct skew and duty cycle of the first to fourth internal clock signals,
(C) a data signal generating circuitry configured to receive data which is read from the respective memory cell array,
to receive the corrected first to fourth internal clock signal, and
to be synchronized with the corrected first to fourth internal clock signals to output a data signal including the data.

16. The memory system of claim 15, wherein phases of the first to fourth internal clock signals each have a respective phase difference of 90 degrees.

17. The memory system of claim 15, wherein the memory device provides the output data signal to the memory controller circuitry.

18. The memory device of claim 1, wherein the plurality of processing circuitries autonomously generate the first to fourth internal clock signal, without being controlled by the memory controller.

19. The memory device of claim 6, wherein the clock signal correction circuitry includes,
a delay locked loop circuit configured to delay the first to fourth internal clock signals to correct the clock skew between the first to fourth internal clock signals,
a duty cycle correction circuit configured to correct the duty cycle of each of the delayed first to fourth internal clock signals,
a clock tree configured to receive the duty cycle-corrected first to fourth internal clock signals, and
a duty cycle detection circuit configured to receive the duty cycle-corrected first to fourth internal clock signals from the clock tree and determine whether conditions of the duty cycle of the first to fourth internal clock signals satisfy a standard.

20. The method of operating a memory device of claim 12, wherein the correcting the duty cycle is configured,
to receive the buffered internal clock signal,
to determine whether condition of the duty cycle of the buffered internal clock signal satisfies a standard and generate an error code, and
to correct the duty cycle of the buffered internal clock signal in response to the error code.

* * * * *